United States Patent [19]

Bonyhard et al.

[11] Patent Number: 5,026,470
[45] Date of Patent: Jun. 25, 1991

[54] SPUTTERING APPARATUS

[75] Inventors: Peter I. Bonyhard, San Martin; David C. Cheng, Palo Alto; William J. Glover, San Jose; Howard A. Hendrix, Livermore; Ernest S. Ward; John W. Williams, both of San Jose, all of Calif.

[73] Assignee: International Business Machines, Armonk, N.Y.

[21] Appl. No.: 452,984

[22] Filed: Dec. 19, 1989

[51] Int. Cl.⁵ .............................................. C23C 14/34
[52] U.S. Cl. .......................... 204/298.16; 204/298.19; 204/298.2; 204/298.23; 204/192.2
[58] Field of Search ........... 204/192.2, 298.06, 298.16, 204/298.19, 298.23, 298.28, 298.2

[56] References Cited

U.S. PATENT DOCUMENTS

| | | | |
|---|---|---|---|
| 4,094,764 | 6/1978 | Boucher et al. | 204/298 |
| 4,247,383 | 1/1981 | Greve et al. | 204/298 |
| 4,673,482 | 6/1987 | Setoyama et al. | 204/298 |
| 4,849,250 | 7/1989 | Dee et al. | 204/192.2 X |

Primary Examiner—Nam X. Nguyen
Attorney, Agent, or Firm—Otto Schmid, Jr.

[57] ABSTRACT

A sputtering apparatus in which the electrode for supporting the substrates upon which thin magnetic films are to be deposited has a polygon-shaped planar coil adjacent to a surface so that the coil can be energized to produce a uniform magnetic field at the surface of the substrates which is oriented normal to the polygon faces of the coil. This apparatus produces uniform easy axis of the thin magnetic films deposited on the substrates during relative motion between the substrates and the target electrode.

6 Claims, 3 Drawing Sheets

SPUTTERING APPARATUS

FIELD OF THE INVENTION

The invention relates to sputtering apparatus and, more particularly, to sputtering apparatus for producing thin films of magnetic material.

BACKGROUND AND PRIOR ART

Sputtering apparatus have been extensively used in the production of thin films of magnetic material. In depositing these films, a variety of properties are of concern, and to achieve these properties, the films are frequently deposited in the presence of an external magnetic field. In the past, permanent magnets have been used to establish the needed magnetic field. In order to increase the processing rate in manufacturing, the substrates, upon which the thin films of magnetic material are deposited, are rotated. This causes substantial fluctuations in the plasma density due to the interaction between the magnetic field and the free electrons of the plasma. Consequently, uniformity of the film properties is poor and difficult to control.

An attempt has been made to introduce electromagnets to sputtering systems. For example, Boucher et al., U.S. Pat. No. 4,094,764, "Device for Cathodic Sputtering at a High Deposition Rate", issued June 13, 1978, disclose a permanent magnet in the vicinity of the target electrode in order to increase the sputtering rate, and it is disclosed that the magnetic field could as well be produced by a solenoid coil. Greve et al., U.S. Pat. No. 4,247,383, "Cathodic System with Target, for Vacuum Sputtering Apparatus for the Application of Dielectric or Nonmagnetic Coatings to Substrates", issued Jan. 27, 1981, show a sputtering apparatus in which a planar coil is used in conjunction with the target electrode to produce increased atomization and therefore a greater sputtering rate for sputtering a dielectric or nonmagnetic coating.

Setoyama et al., U.S. Pat. No. 4,673,482, "Sputtering Apparatus", issued June 16, 1987, disclose a sputtering apparatus for sputtering magnetic thin films in which a pair of coils outside the vacuum chamber produces a magnetic field which extends into the vacuum chamber. The substrate upon which the magnetic thin film is to be deposited is mounted within the vacuum chamber, and a permanent magnet plate is mounted parallel to the substrate surface to improve the uniformity of the magnetic field at the substrate surface.

None of the references discloses or suggests a polygon-shaped planar electromagnetic coil adjacent to a surface of the substrate for maintaining the orientation of deposited films during relative motion between the target and the substrate upon which the magnetic film is deposited.

SUMMARY OF THE INVENTION

It is therefore the principal object of this invention to provide a sputtering apparatus in which a polygon-shaped planar electromagnetic coil is adjacent to the surface of the substrate for maintaining the orientation of deposited thin magnetic films during relative motion between the target and the substrate.

In accordance with the invention, the sputtering apparatus comprises a first electrode for supporting a suitable target material, and a second electrode for supporting at least one substrate adjacent to and in alignment with the first electrode. A polygon-shaped planar coil is provided adjacent to a surface of the second electrode, and means are provided for energizing the coil to produce a magnetic field oriented substantially normal to the polygon faces of the coil. A source of RF power is provided to produce a glow discharge in the space between the two electrodes, and means are provided to produce relative motion between the first and second electrodes so that a uniform coating of a magnetic material can be produced on a substrate supported on the second electrode, with the coating of magnetic material having an axis oriented in a chosen direction.

In a specific embodiment, the coil is embedded within the second electrode and, in a further specific embodiment, the coil is formed within an electromagnetic pallet which is supported by the second electrode during operation of the sputtering apparatus. In another specific embodiment, the coil is formed by photolithographic techniques.

For a fuller understanding of the nature and advantages of the present invention, reference should be made to the following detailed description taken in conjunction with the accompanying drawings.

DESCRIPTION OF THE PREFERRED EMBODIMENT

Figure 1:
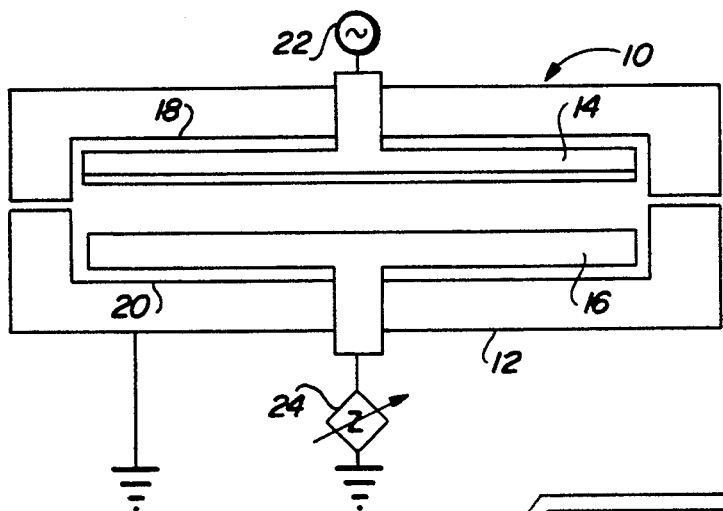
FIG. 1 is a schematic view showing the general arrangement of the elements and the power supply of the sputtering apparatus of the invention.

Referring to FIG. 1, the general structure of the electrode assemblies and the power supply is shown for the sputtering apparatus according to the present invention. The sputtering apparatus 10 of the invention comprises a vacuum enclosure 12 and a vacuum pump (not shown) to evacuate the sputtering enclosure to a desired background pressure level. A suitable gas such as argon, for example, is then fed into the enclosure to provide the necessary background environment for sputter deposition.

A target electrode assembly 14 to which a target body is mounted is positioned within the enclosure 12, and a substrate electrode assembly 16 is positioned adjacent to and facing the target electrode assembly 14. The electrode assemblies 14 and 16 may be water cooled to maintain a desired temperature during operation. To eliminate spurious sputtering that may occur at the back of the electrode assemblies 14 and 16, each electrode assembly 14 and 16 has a ground shield 18 and 20, respectively, surrounding the peripheral and back portions of the electrode assembly, thereby leaving the face of the electrode assemblies exposed for supporting target bodies and substrates to be coated.

The power supply 22 is connected to supply an RF voltage potential across target electrode assembly 14, substrate electrode assembly 16, and variable impedance 24. The capacitive and inductive components of variable impedance 24 can be varied to control the voltage to substrate electrode assembly 16 to provide control over the properties of the films deposited by the sputtering apparatus.

According to the present invention, a novel structure for the substrate electrode assembly 16, which will be described in detail below, enables the sputtering apparatus to produce thin magnetic films with uniform thickness across a substrate and from substrate to substrate while maintaining the easy axis orientation of the deposited films with great precision by means of the magnetic field generated by a planar electromagnetic coil.

Figure 2:
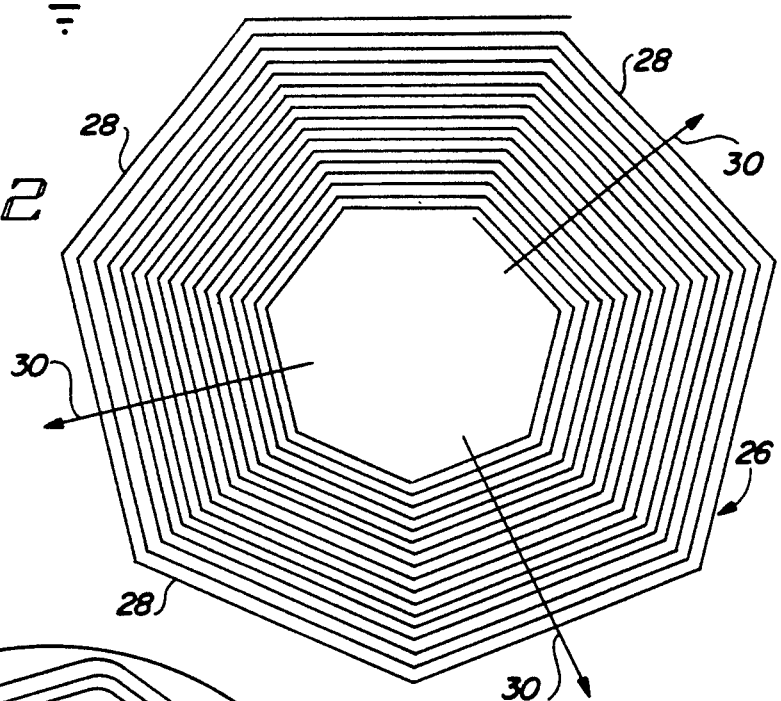
FIG. 2 is a plan view of the polygon-shaped planar coil of the invention.
Figure 3:
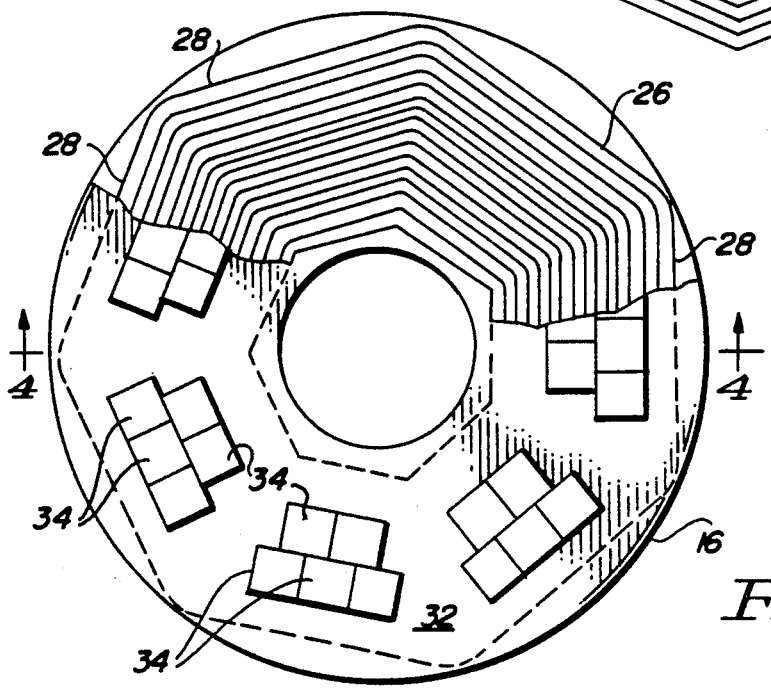
FIG. 3 is a schematic view showing the substrate electrode assembly with substrates loaded.
Figure 4:
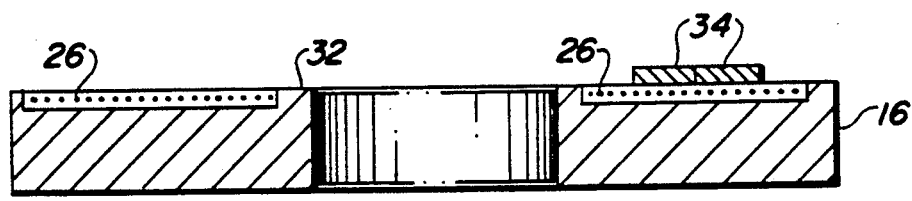
FIG. 4 is a schematic section view taken along lines 4—4 of FIG. 3. assembly.

In accordance with the present invention, the novel structure of the substrate electrode assembly is shown schematically in FIGS. 2, 3, and 4. As shown in FIG. 2, a planar electromagnetic coil 26 is provided, and coil 26 has a plurality of planar sides 28. Coil 26 is a spiral coil so that when the coil is energized with a suitable voltage, a magnetic field is produced with the magnetization oriented normal to the coil which turns at each of the planar sides 28 of the coil as shown by arrows 30.

As shown in FIG. 3, the planar electromagnetic coil 26 is fixed in position at or near the surface 32 of substrate electrode assembly 16, and a plurality of substrates 34 are positioned on the substrate electrode assembly 16. The substrates 34 are positioned so that an edge is parallel to one of the planar sides 28 of the planar electromagnetic coil 26. The section view of the substrate electrode assembly, FIG. 4, shows that the substrates 34 are in close proximity to the planar electromagnetic coil 26. The substrate electrode assembly is normally water cooled, but this structure is not included in the schematic showing of FIG. 4. This orientation of the substrates 34 enables a thin film of a magnetic material to be sputtered upon each of the substrates 34 with the easy axis oriented in a chosen direction to a very close tolerance. In addition, the thickness of the sputtered magnetic material is uniform to a very close tolerance over all the plurality of substrates 34 since there is little interaction between the magnetic field produced by coil 26 and the plasma when relative motion is produced between the target electrode assembly 14 and the substrate electrode assembly 16 during operation of the sputtering apparatus.

Figure 5:
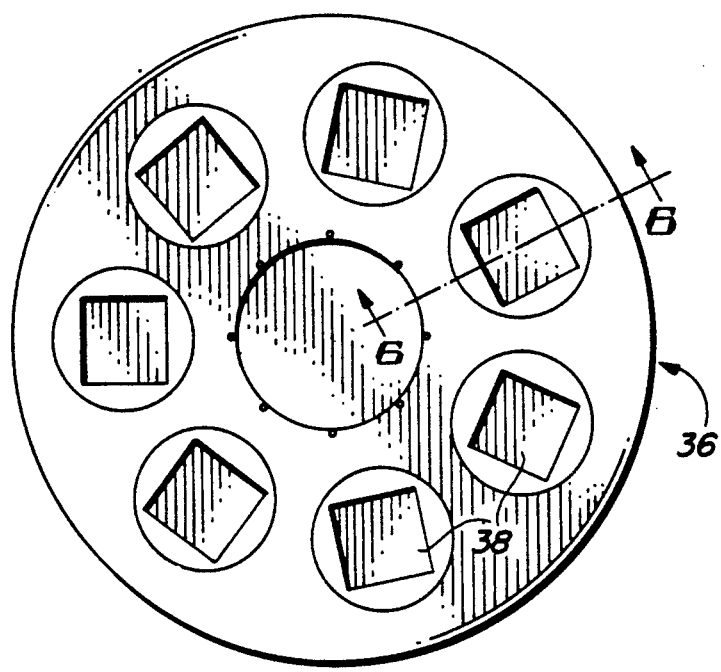
FIG. 5 is a plan view of an electromagnetic pallet assembly.
Figure 6:
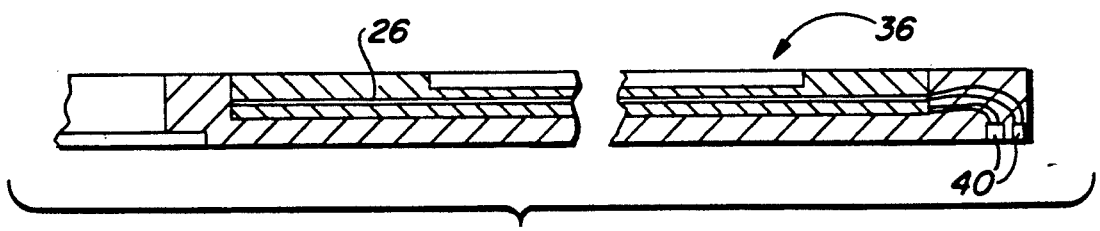
FIG. 6 is a section view taken along lines 6—6 of FIG. 5.

An alternate embodiment of the substrate electrode assembly is shown in FIGS. 5 and 6. In this embodiment, the planar electromagnetic coil 26 is embedded within an electromagnetic pallet assembly 36, which also serves as a support for the substrates 38 during sputtering. The coil 26 is a spiral coil, and both ends of the coil are connected to commutator rings 40 at the periphery of the pallet assembly 36 so that electrical contact can be maintained to the pallet assembly during rotation.

Figure 7:
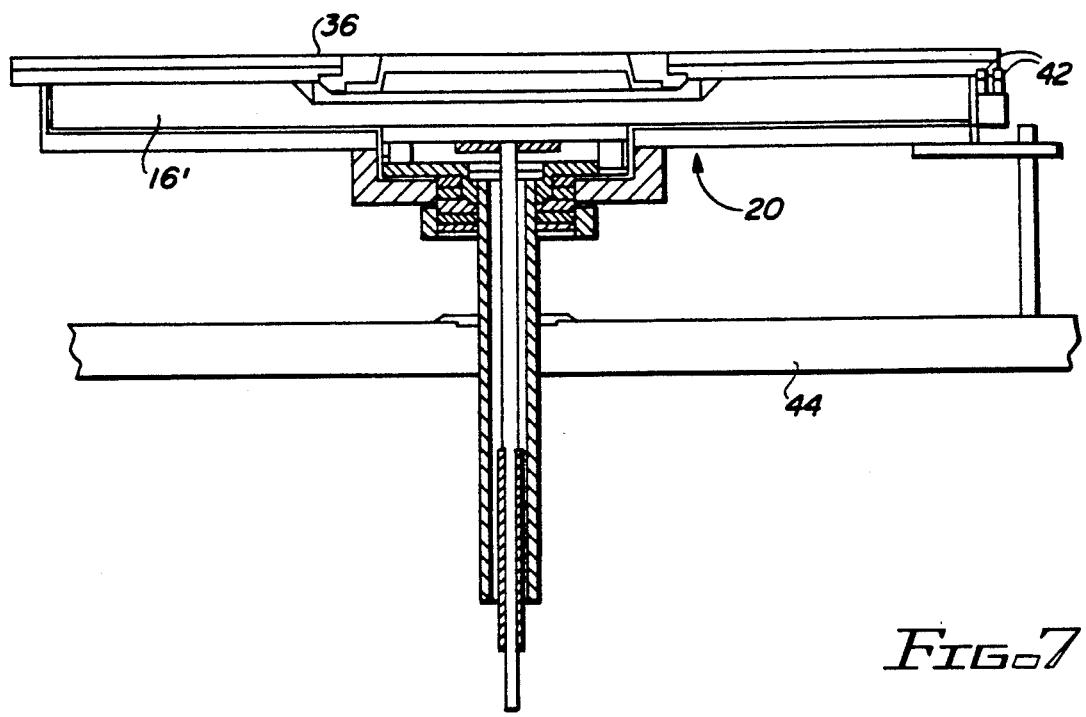
FIG. 7 is a side view of the substrate electrode assembly with the electromagnetic pallet in operative position.

As shown in FIG. 7, the electromagnetic pallet assembly 36 is mounted directly upon the substrate electrode assembly 16', and contactors 42 are fixed to vacuum enclosure baseplate 44 and extend into a position to provide electrical contact to commutator rings 40 so that the planar electromagnetic coil 26 can be energized during rotation of the substrate electrode assembly 16'.

The substrates 38 can be loaded onto the electromagnetic pallet assembly outside the sputtering apparatus, and loaded along with the electromagnetic pallet assembly 36.

Figure 8:
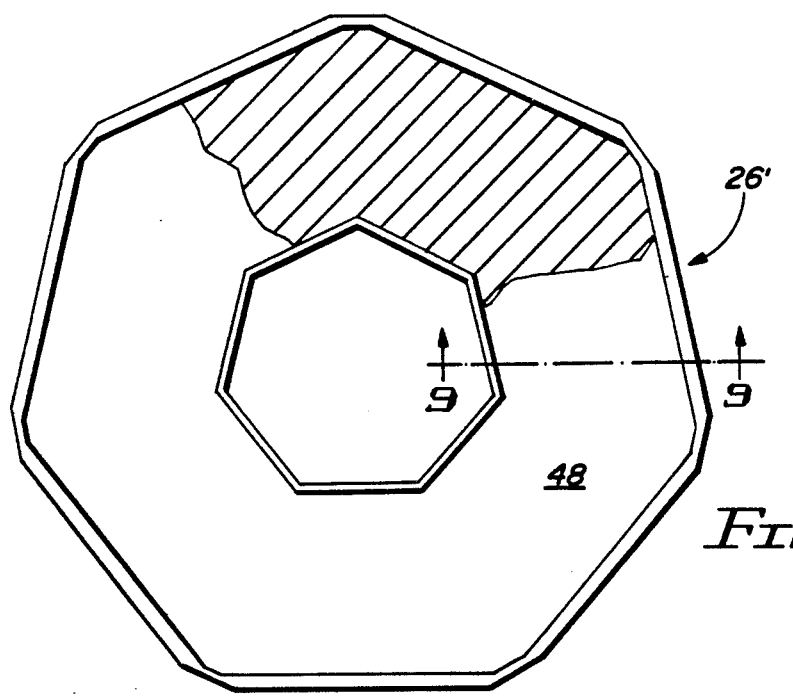
FIG. 8 is a plan view of an alternate embodiment of the polygon-shaped planar coil.
Figure 9:
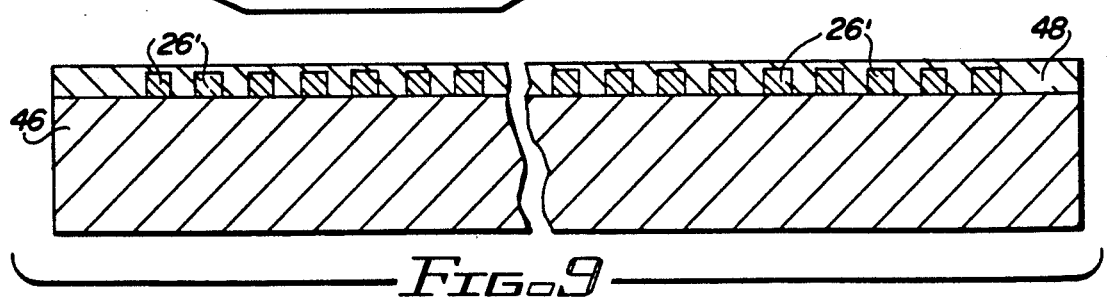
FIG. 9 is a section view taken along lines 8—8 of FIG. 7.

An alternate embodiment of the planar electromagnetic coil is shown in FIGS. 8 and 9. In this embodiment, the planar electromagnetic coil 26' is produced by photolithographic techniques to produce a polygon-shaped planar coil 26' on one surface of the substrate 46. The substrate 46 may comprise any suitable dielectric material such as fiberglass-filled epoxy, for example. A dielectric coating 48 is provided on top of the coil 26', and this coating may comprise an epoxy resin, for example.

The production of the coil by photolithographic techniques permits the coil to be produced with greater accuracy at lower cost. In addition, if desired, the coil can be produced in a plurality of layers. Each of the layers is connected in parallel so that a greater field strength can be produced by the same current as that required for the single-layer coil or, alternatively, a lower current can be used to produce the same field strength as that produced by the single-layer coil. The connection of the plurality of layers in parallel produces a lower resistance, while permitting a higher magnetic field due to the increased ampere turns. This results in lower heat dissipation for the coil due to the lower resistance from the parallel connection.

While the preferred embodiments of the present invention have been illustrated in detail, it should be apparent that modifications and adaptations to those embodiments may occur to one skilled in the art without departing from the scope of the present invention as set forth in the following claims.

Having thus described our invention, what we claim as new and desire to secure by Letters Patent is:

1. Sputtering apparatus for coating a substrate with a magnetic material having an axis oriented in a chosen direction comprising:

a first electrode for supporting target material;

a second electrode for supporting at least one substrate adjacent to and in alignment with said first electrode; said second electrode having a polygon-shaped planar coil having polygon faces adjacent a surface thereof and means for energizing said coil to form a uniform magnetic field on said surface oriented substantially normal to the polygon faces of said coil;

a source of RF power arranged to impose an RF voltage across said first and said second electrodes to produce a glow discharge in the space between said first and said second electrodes; and means for producing relative motion between said first and said second electrodes in a plane parallel to said planar coil whereby a uniform coating of magnetic material can be deposited on a substrate supported on said second electrode with the coating of magnetic material having an axis oriented in a chosen direction.

2. The sputtering apparatus of claim 1, wherein said polygon-shaped planar coil is embedded within said second electrode.

3. The sputtering apparatus of claim 2, comprising a plurality of substrates, each oriented with a reference edge parallel to one of said polygon faces of said polygon-shaped planar coil.

4. The sputtering apparatus of claim 1, additionally comprising:

a pallet member; and means for incorporating said polygon-shaped planar coil into said pallet member.

5. The sputtering apparatus of claim 4, comprising a plurality of substrates, each oriented with a reference edge parallel to one of said polygon faces of said polygon-shaped planar coil.

6. The sputtering apparatus of claim 5, wherein said polygon-shaped planar coil is formed by photolithographic techniques.

* * * * *